United States Patent
Huang

(10) Patent No.: US 7,902,828 B2
(45) Date of Patent: *Mar. 8, 2011

(54) METHOD AND APPARATUS FOR MONITORING THE CONDITION OF A BATTERY BY MEASURING ITS INTERNAL RESISTANCE

(75) Inventor: Yung-Sheng Huang, Taipei (TW)

(73) Assignee: BPPower, Inc., Taipei (TW)

( * ) Notice: Subject to any disclaimer, the term of this patent is extended or adjusted under 35 U.S.C. 154(b) by 668 days.

This patent is subject to a terminal disclaimer.

(21) Appl. No.: 11/984,669

(22) Filed: Nov. 20, 2007

(65) Prior Publication Data

US 2008/0094069 A1    Apr. 24, 2008

Related U.S. Application Data

(63) Continuation-in-part of application No. 11/356,117, filed on Feb. 17, 2006, now abandoned.

(51) Int. Cl.
*G01N 27/416* (2006.01)
(52) U.S. Cl. .......................................... 324/430; 324/433
(58) Field of Classification Search .................. 324/430, 324/433
See application file for complete search history.

(56) References Cited

U.S. PATENT DOCUMENTS

| | | |
|---|---|---|
| 3,781,658 A | 12/1973 | Godshalk |
| 3,852,732 A | 12/1974 | Yorksie et al. |
| 3,873,911 A | 3/1975 | Champlin |
| 3,876,931 A | 4/1975 | Godshalk |
| 3,909,708 A | 9/1975 | Champlin |
| 3,984,762 A | 10/1976 | Dowgiallo, Jr. |
| 4,025,916 A | 5/1977 | Arnold et al. |
| 4,052,717 A | 10/1977 | Arnold et al. |
| 4,193,025 A | 3/1980 | Frailing et al. |
| 4,193,026 A | 3/1980 | Finger et al. |
| 4,231,027 A | 10/1980 | Mann |
| 4,290,021 A | 9/1981 | Theron et al. |
| 4,333,149 A | 6/1982 | Taylor et al. |

(Continued)

FOREIGN PATENT DOCUMENTS

JP          9061505         3/1997

(Continued)

OTHER PUBLICATIONS

Feder et al, Field and Laboratory Studies to Assess the State of Health of Valve-Regulated Lead Acid Batteries, IEEE (1992).

(Continued)

*Primary Examiner* — Edward Tso
*Assistant Examiner* — M'Baye Diao
(74) *Attorney, Agent, or Firm* — Michael de Angeli

(57) ABSTRACT

A method for evaluating the condition of a battery comprises coupling a first power transistor as or as part of a first external load in series with the battery, coupling a second power transistor as or as part of a second external load in series with the battery, and conducting each power transistor to draw a transient large current from the battery while sampling the voltage across the battery and voltage across the load, from which the internal resistance of the battery can be determined. The internal resistance of the battery can then be compared with a predetermined nominal value to issue a warning if the battery is weak. The invention enables, for example, a driver to correctly know the actual condition of an automobile battery in substantially real time while consuming a minimum amount of power.

32 Claims, 6 Drawing Sheets

U.S. PATENT DOCUMENTS

| | | | |
|---|---|---|---|
| 4,361,809 A | 11/1982 | Bil et al. | |
| 4,423,378 A | 12/1983 | Marino et al. | |
| 4,423,379 A | 12/1983 | Jacobs et al. | |
| 4,678,998 A | 7/1987 | Muramatsu | |
| 4,697,134 A | 9/1987 | Burkum et al. | |
| 4,719,428 A | 1/1988 | Liebermann | |
| 4,743,855 A | 5/1988 | Randin et al. | |
| 4,816,768 A | 3/1989 | Champlin | |
| 4,825,170 A | 4/1989 | Champlin | |
| 4,888,716 A | 12/1989 | Ueno | |
| 4,912,416 A | 3/1990 | Champlin | |
| 4,937,528 A | 6/1990 | Palanisamy | |
| 4,952,862 A | 8/1990 | Biagetti et al. | |
| 5,027,294 A | 6/1991 | Fakruddin et al. | |
| 5,047,722 A | 9/1991 | Wurst et al. | |
| 5,047,961 A | 9/1991 | Simonsen | |
| 5,049,803 A | 9/1991 | Palanisamy | |
| 5,061,898 A | 10/1991 | Oram et al. | |
| 5,124,627 A | 6/1992 | Okada | |
| 5,130,699 A | 7/1992 | Reher et al. | |
| 5,137,020 A | 8/1992 | Wayne | |
| 5,140,269 A | 8/1992 | Champlin | |
| 5,159,272 A | 10/1992 | Rao et al. | |
| 5,193,067 A | 3/1993 | Sato et al. | |
| 5,195,813 A | 3/1993 | Brown | |
| 5,206,097 A | 4/1993 | Burns | |
| 5,281,919 A | 1/1994 | Palanisamy | |
| 5,298,346 A | 3/1994 | Gyenes | |
| 5,315,228 A | 5/1994 | Hess et al. | |
| 5,321,627 A | 6/1994 | Reher | |
| 5,349,282 A | 9/1994 | McClure | |
| 5,349,535 A | 9/1994 | Gupta | |
| 5,357,203 A | 10/1994 | Landau et al. | |
| 5,381,096 A | 1/1995 | Hirzel | |
| 5,459,671 A | 10/1995 | Duley | |
| 5,469,042 A | 11/1995 | Ruhling | |
| 5,488,282 A | 1/1996 | Hayden | |
| 5,496,658 A | 3/1996 | Hein et al. | |
| 5,519,304 A | 5/1996 | Andrieu et al. | |
| 5,521,443 A | 5/1996 | Imura | |
| 5,555,498 A | 9/1996 | Berra | |
| 5,572,136 A | 11/1996 | Champlin | |
| 5,578,915 A | 11/1996 | Crouch, Jr. et al. | |
| 5,578,927 A | 11/1996 | Perelle | |
| 5,585,728 A | 12/1996 | Champlin | |
| 5,596,567 A | 1/1997 | de Muro | |
| 5,600,230 A | 2/1997 | Dunstan | |
| 5,606,242 A | 2/1997 | Hull | |
| 5,621,298 A | 4/1997 | Harvey | |
| 5,633,573 A | 5/1997 | van Phuoc et al. | |
| 5,703,464 A | 12/1997 | Karunasiri | |
| 5,705,929 A | 1/1998 | Caravello et al. | |
| 5,721,688 A | 2/1998 | Bramwell | |
| 5,751,217 A | 5/1998 | Kchao et al. | |
| 5,764,469 A | 6/1998 | Slepian et al. | |
| 5,821,756 A | 10/1998 | McShane et al. | |
| 5,828,218 A | 10/1998 | Yokoo | |
| 5,831,435 A | 11/1998 | Troy | |
| 5,895,440 A | 4/1999 | Proctor et al. | |
| 5,900,734 A | 5/1999 | Munson | |
| 5,963,012 A | 10/1999 | Garcia | |
| 5,973,499 A * | 10/1999 | Schulmann | 324/503 |
| 6,020,717 A | 2/2000 | Kadouchi | |
| 6,061,638 A | 5/2000 | Joyce | |
| 6,064,180 A | 5/2000 | Sullivan | |
| 6,072,300 A | 6/2000 | Tsuji | |
| 6,081,098 A | 6/2000 | Bertness et al. | |
| 6,097,193 A | 8/2000 | Bramwell | |
| 6,121,753 A | 9/2000 | Walker et al. | |
| 6,133,709 A | 10/2000 | Puchianu | |
| 6,184,656 B1 | 2/2001 | Karunasiri | |
| 6,201,373 B1 | 3/2001 | Arai et al. | |
| 6,242,891 B1 * | 6/2001 | Parsonage | 320/132 |
| 6,249,106 B1 | 6/2001 | Turner et al. | |
| 6,263,268 B1 | 7/2001 | Nathanson | |
| 6,268,732 B1 | 7/2001 | Jones et al. | |
| 6,271,647 B2 | 8/2001 | Galbraith et al. | |
| 6,313,608 B1 | 11/2001 | Varghese et al. | |
| 6,331,762 B1 | 12/2001 | Bertness | |
| 6,392,414 B2 | 5/2002 | Bertness | |
| 6,411,912 B1 | 6/2002 | Sack | |
| 6,424,157 B1 | 7/2002 | Gollomp | |
| 6,466,026 B1 | 10/2002 | Champlin | |
| 6,469,511 B1 | 10/2002 | Vonderhaar et al. | |
| 6,469,512 B2 | 10/2002 | Singh et al. | |
| 6,531,875 B2 | 3/2003 | Satake | |
| 6,586,941 B2 | 7/2003 | Bertness et al. | |
| 6,611,774 B1 | 8/2003 | Zaccaria | |
| 6,633,165 B2 | 10/2003 | Bertness | |
| 6,677,759 B2 | 1/2004 | Friel | |
| 6,696,819 B2 | 2/2004 | Bertness | |
| 6,704,629 B2 | 3/2004 | Huang | |
| 6,791,464 B2 | 9/2004 | Huang | |
| 6,806,716 B2 | 10/2004 | Bertness et al. | |
| 6,850,037 B2 | 2/2005 | Bertness | |
| 6,871,151 B2 | 3/2005 | Bertness | |
| 6,888,468 B2 | 5/2005 | Bertness | |
| 6,909,287 B2 | 6/2005 | Bertness | |
| 7,003,411 B2 | 2/2006 | Bertness | |
| 7,015,674 B2 | 3/2006 | Vonder Haar | |
| 7,058,525 B2 | 6/2006 | Bertness et al. | |
| 7,212,006 B2 | 5/2007 | Huang | |
| 2003/0067221 A1 | 4/2003 | Disser et al. | |

FOREIGN PATENT DOCUMENTS

| | | |
|---|---|---|
| JP | 10056744 | 2/1998 |

OTHER PUBLICATIONS

Berndt et al, "Monitoring of Stationary Valve-Regulated Lead Acid Batteries" (IEEE, 1991).

* cited by examiner

METHOD AND APPARATUS FOR MONITORING THE CONDITION OF A BATTERY BY MEASURING ITS INTERNAL RESISTANCE

CROSS-REFERENCE TO RELATED APPLICATION

This application is a continuation-in-part of application Ser. No. 11/356,117, filed Feb. 17, 2006 now abandoned.

BACKGROUND OF THE INVENTION

1. Field of the Invention

The present invention relates to monitoring apparatus and more particularly to a method of monitoring the condition of a battery by measuring the internal resistance of the battery. The resistance of the battery is measured by connecting a first external load across the battery to obtain a reference voltage and then connecting a second external load across the battery to obtain a load voltage. The external loads can be the internal resistances of power transistors. The difference between the reference and load voltages can be employed to determine the internal resistance of the battery, which can then be compared with a predetermined warning value thereof such that a warning can be displayed if the power is lower than a predetermined level prior to starting the engine. The present invention further particularly relates to such a monitoring apparatus.

2. Description of Related Art

It is known that a driver has to start the engine of a motor vehicle before driving it. Also, for successfully starting the engine, there must be sufficient electric power stored in the battery. Typically, a battery has an approximate lifetime. However, factors such as ambient temperature, charging conditions and time, and load discharge all can adversely affect the lifetime of the battery. Thus, there is a difference between the practical lifetime and the approximate lifetime of any particular battery, and the difference is sometimes very large. Hence, in practice, there is no way for a driver (even an experienced one) to know the electric power level of the battery prior to starting the engine. Typically, only a motor vehicle repair shop technician is able to know the electric power level by means of a test device. However, the test device is somewhat bulky, thus prohibiting it from being carried by the motor vehicle. It is common that a driver finds the battery to be low only when it fails to start the engine. Alternatively, the battery may be already damaged but the driver is not aware before next start even it is successful in a particular start. This is not desirable and may even be dangerous since the driver may park his/her car in a remote area, mountain, or desert.

Advantageously, a battery power measuring device would be installed in a car as requisite equipment. But measuring the power of the battery may also consume the power of the battery. Hence, frequent power measurements are not desirable. Thus, it is especially desirable to accurately measure the power of a battery in a relatively short period of time and so as to consume a minimum amount of electric power. It is also important to measure the power of the battery while installed in the vehicle, which requires that the measurement technique employed be capable of providing accurate results even though unknown amounts of current may be flowing into and out of the battery at any time, due to the presence of battery chargers, alternators and the like on the one hand, and starting, lighting and accessory loads on the other.

The present application is relevant to commonly assigned U.S. Pat. Nos. 6,704,629 and 6,791,464 both entitled "Device for Monitoring Motor Vehicle's Electric Power and Method Thereof", and to commonly assigned U.S. Pat. No. 7,212,006, entitled "Method and Apparatus for Monitoring the Condition of a Battery by Measuring its Internal Resistance." The latter patent relates to a method and apparatus for monitoring the condition of a battery by measuring its internal resistance at two terminals of the battery by using a floating voltage $V_0$ as its reference voltage to compare with a sampling voltage. However, the value of the floating voltage $V_0$ itself is not stable as it will be affected by intermittent charging of the battery, up and down variation of the load at the battery, aging of the battery, and other factors.

Tsuji U.S. Pat. No. 6,072,300 relates to characterization of the individual batteries of a large set of batteries. Internal resistance is estimated from cell voltage. See Col. 5, lines 32-38.

Fakruddin U.S. Pat. No. 5,027,294 also characterizes battery condition based on measurements of voltage.

Huang U.S. Pat. No. 6,704,629, to the present inventor, measures battery condition in part by drawing a substantial current from the battery by connecting a significant load to it for a short period of time, as is part of the method of the present invention, but measures voltage only.

Arai U.S. Pat. No. 6,201,373 shows a circuit for measuring the state of charge (SOC) of a battery, not a battery condition evaluation device per se. Voltage and current are both sampled.

Hirzel U.S. Pat. No. 5,381,096 also relates to SOC measurement.

Satake U.S. Pat. No. 6,531,875 teaches estimating the open circuit voltage of a battery based on extrapolation from a series of measurements.

Disser et al. Pub. No. US 2003/0067221 A1 shows voltage regulator circuitry for automotive use.

Yokoo U.S. Pat. No. 5,828,218 shows a method for estimating residual capacity of a battery based on discharge current and voltage during discharge.

Munson U.S. Pat. No. 5,900,734 shows a battery monitoring system wherein the battery voltage is compared to a fixed reference value and an alarm is given when the battery voltage is less than the reference value.

Bramwell U.S. Pat. Nos. 5,721,688 and 6,097,193 discuss various methods of measuring the internal resistance and/or impedance of a battery, including application of a small AC signal to the battery and using a Wheatstone bridge or equivalent to measure the internal resistance. See col. 1, lines 40-48. Bramwell's claimed method includes the steps of measuring impedance of a battery by sourcing to or sinking from the battery a current of known magnitude at intervals while the vehicle sits. Col. 9, lines 18-50.

Turner et al. U.S. Pat. No. 6,249,106 shows a circuit for preventing discharge of a battery beyond a predetermined point. Yorksie et al. U.S. Pat. No. 3,852,732 is directed toward the same objective. Finger et al. U.S. Pat. No. 4,193,026 is directed to measuring the SOC of a battery by integrating a signal indicative of reduction of the terminal voltage below a threshold value.

Reher et al. U.S. Pat. No. 5,130,699 shows a device for monitoring a battery by measuring the terminal voltage at regular intervals, comparing the measured values to a predetermined value, and setting a flag in a shift register depending on the result. When a predetermined number of flags indicate an under voltage condition an alarm is given.

Sato et al. U.S. Pat. No. 5,193,067 discloses determining the internal impedance of a battery by measuring the voltage during discharge of a predetermined current, or by measuring the current during discharge at a predetermined voltage.

Slepian U.S. Pat. No. 5,764,469 shows disconnecting electronic equipment of a vehicle when the battery voltage falls below a predetermined level.

Huang U.S. Pat. No. 6,791,464, to the present inventor, shows evaluation of the condition of a motor vehicle's battery by monitoring the voltage across the battery during starting, while the starter provides a substantial load. The minimum voltage reached during starting can be compared to predetermined value to evaluate the condition of the battery.

Gollomp et al. U.S. Pat. No. 6,424,157 refers to the difficulty of measuring battery SOC from open-circuit voltage (OCV) because this requires that everything be disconnected. Gollomp instead teaches monitoring of the quiescent voltage (QV), e.g., measured at 30 minute intervals while the vehicle sits. Col. 9, lines 18-50. An alarm message can be given when QV falls below a predetermined point—Col. 11, lines 28-39. Gollomp also teaches monitoring of voltage and current during engine starting. See FIG. 6. This data is stored in memory, see Col. 12, lines 48-50, and used to determine dynamic internal resistance (IR) and polarization resistance (PR). Gollomp also teaches monitoring SOC and QV over time to determine when the battery won't be able to start the car; see FIG. 3, Col. 14, line 22-Col. 16, line 36. Gollomp also teaches storing the first IR value of the battery, or some subsequent one, for "future use"—e.g., determination of IR change over time. PR is similarly monitored over time; see Col. 17, line 12-Col. 18, line 35. The result is to give warning of incipient battery failure or some problem with connections or the like. These data can be monitored during successive starts; see claim 1.

Kchao U.S. Pat. No. 5,751,217 shows a method and circuit for assessing battery impedance, which is stated to be applicable only to fully charged batteries, see Col. 3, lines 49-55, and Col. 4, line 12, and which is intended to be incorporated in a battery charger. The apparatus of the invention is not limited to fully charged batteries and can be economically provided as a stand-alone unit.

OBJECTS AND SUMMARY OF THE INVENTION

It is an object of the present invention to provide an apparatus for long-term monitoring of a battery, which repetitively tests the battery by drawing a large current for a relatively transient (i.e, very short) sampling time, thus consuming a minimum amount of electric power. A warning can be displayed for the driver via an I/O operation if the power is lower than a predetermined level during running of the engine or prior to starting the engine.

It is a further object of the present invention to provide a method of monitoring electric power of a battery, which can be accomplished by (1) setting a resistance of an external load based on battery type; (2) setting a nominal internal resistance of the battery to be measured; (3) transiently sampling the voltage at the two terminals of the battery and across the load while employing a first power transistor to draw a transient large current, preferably for several successive sampling intervals, and determining an average of each group of these sampled reference voltages; (4) transiently sampling the voltage at two terminals of the battery and across a second load while employing a second power transistor to draw a transient large current, again preferably for several successive sampling intervals and determining averages of each group of these sampled load voltages; (5) removing the first and second power transistors; (6) dividing the difference between the sampled load voltage and the sampled reference voltage as measured across the first and second load by the resistance of the external load to obtain a transient large current of the battery; (7) dividing a difference between the average sampled reference voltage and the average sampled load voltage measured across the battery by the transient large current of the battery to obtain the internal resistance of the battery; (8) comparing the obtained internal resistance of the battery to the nominal value of the internal resistance of the battery, so as to determine whether the former is equal to or larger than the predetermined warning value; and (9) issuing a warning through an I/O operation if the determination in step (8) is affirmative. By utilizing this method, it is possible to enable a driver to know the actual electric power capacity of the battery in substantially real time.

It is another object of the present invention to provide a method of monitoring electric power of a battery, comprising the steps of:

(1) coupling a first power transistor across the two terminals of the battery as a first external load, so as to draw a first transient large current for a very transient sampling time, while measuring the voltage across the battery, thus obtaining a reference voltage;

(2) coupling a second power transistor across the two terminals of the battery as a second external load, so as to draw a second transient large current for a very transient sampling time, while measuring the voltage across the battery, thus obtaining a load voltage, and measuring the second transient large current; and (3) calculating the internal resistance of the battery by subtracting the load voltage from the reference voltage and dividing by the second transient large current.

It is a further object of the present invention to provide an apparatus for monitoring electric power of a battery, comprising a MCU (microprocessor control unit) responsible for controlling the apparatus so as to sample a voltage of the battery at predetermined intervals of time, calculate an internal resistance of the battery, and compare the internal resistance of the battery with a predetermined nominal value of the internal resistance of the battery; first and second external loads both selectively coupled in series with the battery so as to calculate the internal resistance of the battery; a voltage-sampling circuit responsible for sampling the voltage across the two terminals of the battery; a transient current control circuit including a first power transistor in series with or serving as the first external load, and a second power transistor in series with or serving as the second external load so as to be controlled by the MCU for serving as a switch of the apparatus and being responsible for controlling the magnitude of the transient current drawn through the first and second power transistors, while sampling the voltage of the battery; and an I/O device responsible for issuing a warning if the comparison done by the MCU shows that the internal resistance of the battery is equal to or larger than the predetermined nominal value of the internal resistance of the battery.

The above and other objects, features and advantages of the present invention will become apparent from the following detailed description taken with the accompanying drawings.

DETAILED DESCRIPTION OF THE PREFERRED EMBODIMENTS

Figure 8:
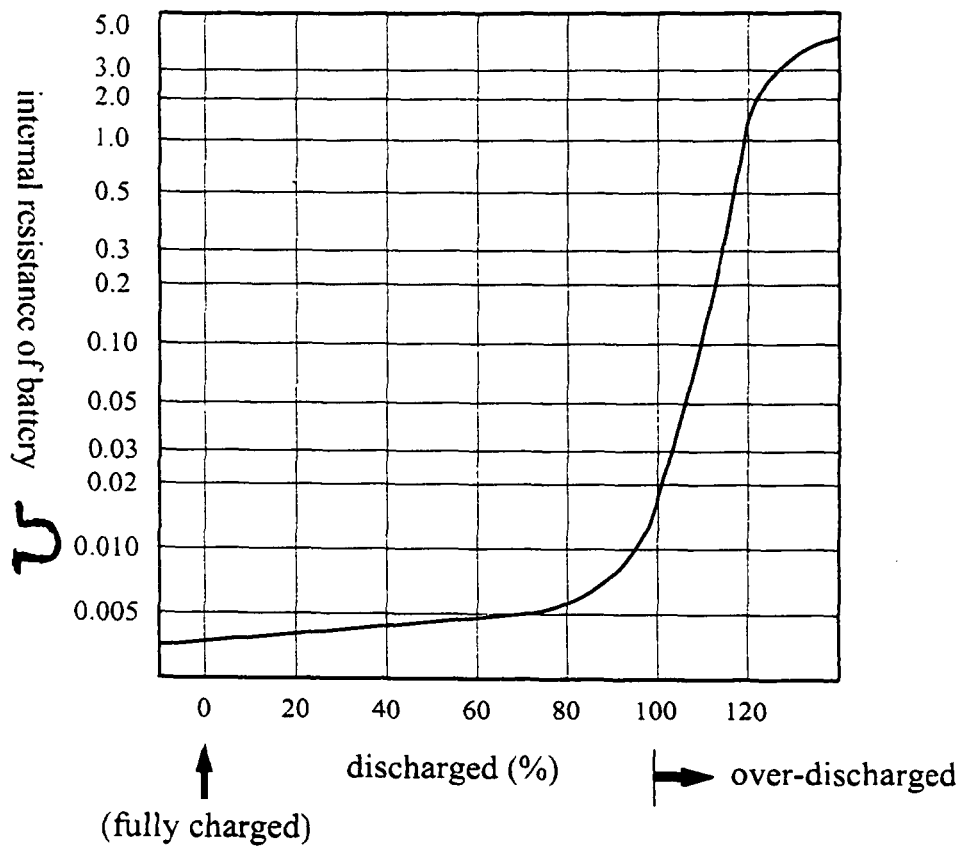
FIG. 8 plots internal resistance of the battery versus discharge percentage for a discharge curve according to the invention.
Figure 9:
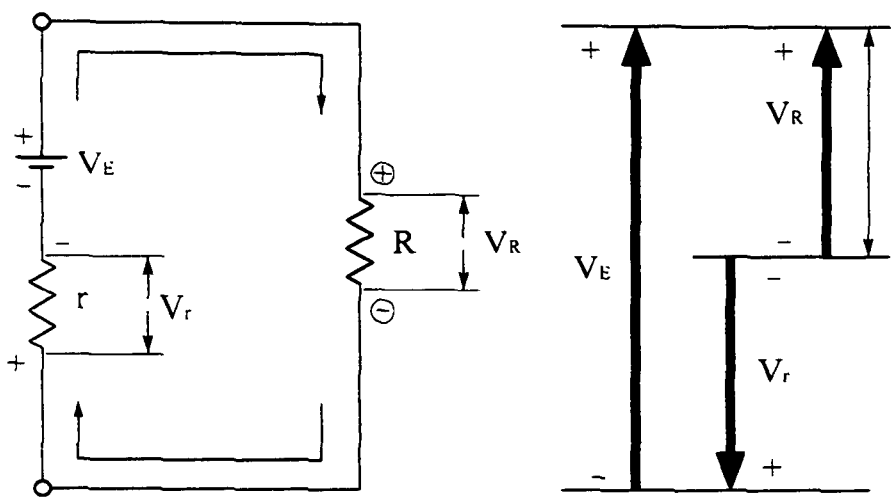
FIG. 9 is an equivalent circuit of the battery and a series external load according to the invention.

FIG. 9 illustrates an equivalent circuit of a battery in series with a load R. The voltage drop across the load R, that is, $V_R$, is equal to the voltage provided by the battery itself, $V_E$, less the voltage drop $V_r$ across the internal resistance r of the battery. Thus, if r can be determined $V_E$ can then be evaluated. $V_E$ is directly indicative of the condition of the battery. In practice, determination of r is itself sufficient to evaluate the condition of the battery, as discussed below in connection with FIG. 8.

Figure 1:
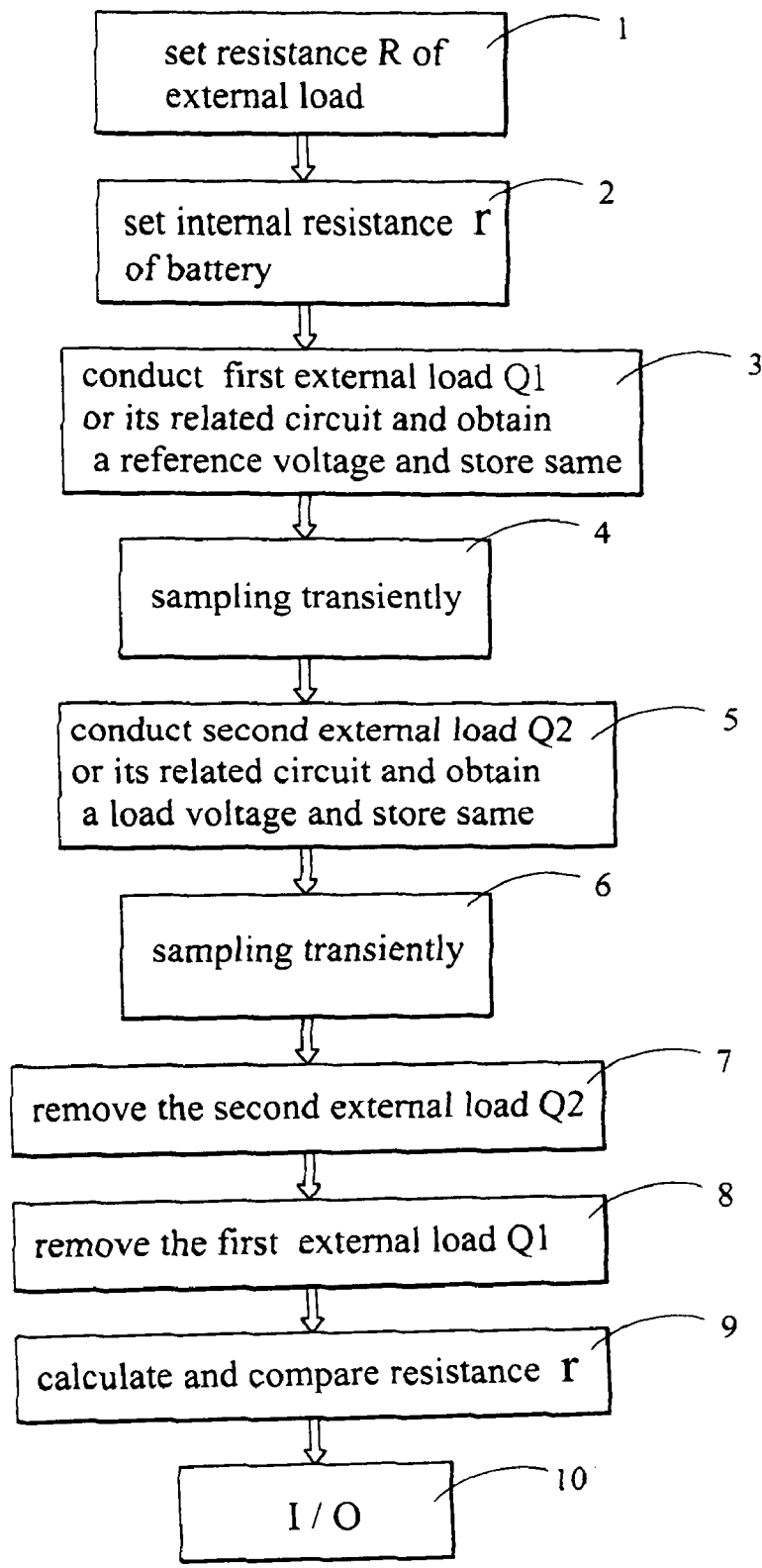
FIG. 1 is a flow chart illustrating a process of monitoring the electric power, i.e. the condition, of battery according to the invention.

Referring to FIGS. 1 and 8, a process of monitoring the electric power of a battery (e.g., one installed in an automobile) according to the invention is illustrated.

In step 1, the resistance R of an external load is set, that is, is selected from values between 25 uΩ to 5000 mΩ, based on battery type and the internal resistance of the battery to be measured.

In step 2, the predetermined nominal value to which the internal resistance r of the battery will be compared is selected from the range of 0.001Ω to 1.5Ω based on the battery type. An appropriate setting depends on the specific application so as to provide a predetermined value, a warning range, or one of a plurality of predetermined warning values for multiple stages of warning before the end of discharging.

In steps 3 and 4, reference voltages across the battery and a first load are measured. A first power transistor Q1 is controlled to draw a large current from the battery. The transistor Q1 can serve as a first external load, or a separate or additional load can also be provided. The reference voltages across the two terminals of the battery and the external load are sampled while a transient large current is drawn by the first external load by controlling the first power transistor Q1 to conduct transiently for a plurality of times, that is intermittently, so as to obtain a plurality of an average of each group of first and second sampled reference voltages. Battery and load reference voltage curves are formed by connecting a plurality of the first and second sampled reference voltages together.

In steps 5 and 6, load voltages across the battery and a second load are measured. A second power transistor Q2 is controlled to draw a second large current; transistor Q2 can serve as the load, or a separate or additional load may be employed. The load voltages across the two terminals of the battery and the second external load are sampled while a transient large current is drawn by the second external load by controlling the second power transistor Q2 to conduct transiently for a plurality of times, that is intermittently, so as to obtain an average of each group of first and second sampled load voltages. Battery and load voltage curves are formed by connecting a plurality of the first and second sampled load voltages together.

In step 7, remove the second external load (i.e., the transistor Q2).

In step 8, remove the first external load (i.e., the transistor Q1).

In step 9, the difference between the average load voltage and the average reference voltage as measured across the external load is divided by the resistance of the external load R to obtain the current I drawn from the battery during the application of the second load. In turn, the internal resistance r of the battery is obtained by dividing the difference between average reference voltage and average load voltage measured across the battery by the current I drawn from the battery. Next, the obtained internal resistance of the battery is compared with the predetermined nominal value of internal resistance r of the battery so as to determine whether the former is in a predetermined warning range.

More specifically, FIG. 8 shows a graph of internal resistance of a typical battery as a function of the degree to which the battery is charged or discharged. Thus, the value determined for the internal resistance r of the battery according to the method of the invention can be compared in step 9 to stored values and a corresponding output indicative of the condition of the battery provided to an operator, central monitoring station or the like.

In step 10, an input and output (I/O) operation is performed in response to the comparison result in step 9. The I/O device and technique may be involve one or more of the following: a display, a keyboard input, a wireless operation, USB (Universal Serial Bus) connector, databus, CAN (Controller Area Network) bus, GPS (Global Positioning System), SMS (Simple Message Service), MMS (Multimedia Message Service), WAP (Wireless Application Protocol), network or an access to the Internet.

Summarizing the method of the invention, a first load is applied to the battery, and a reference voltage is recorded. A second different load is then applied, and a second voltage measured, while the current is also measured. The internal resistance of the battery is then equal to the difference between the two voltages measured across the battery divided by the current drawn under load. Several different methods of measuring the current are possible; that described above involves measuring the voltages across the first and second loads, and dividing the differences between the voltages by the known resistance of the second load. Other methods of measuring the current are described below.

The advantage of the method is that immunity from noise and the presence of external sources of charge, loads, and the like is provided by recording the reference voltage in a first step and subsequently measuring the load voltage responsive to application of a second load. This allows the device to be employed while the battery is still connected, e.g., in an automobile.

Figure 2:
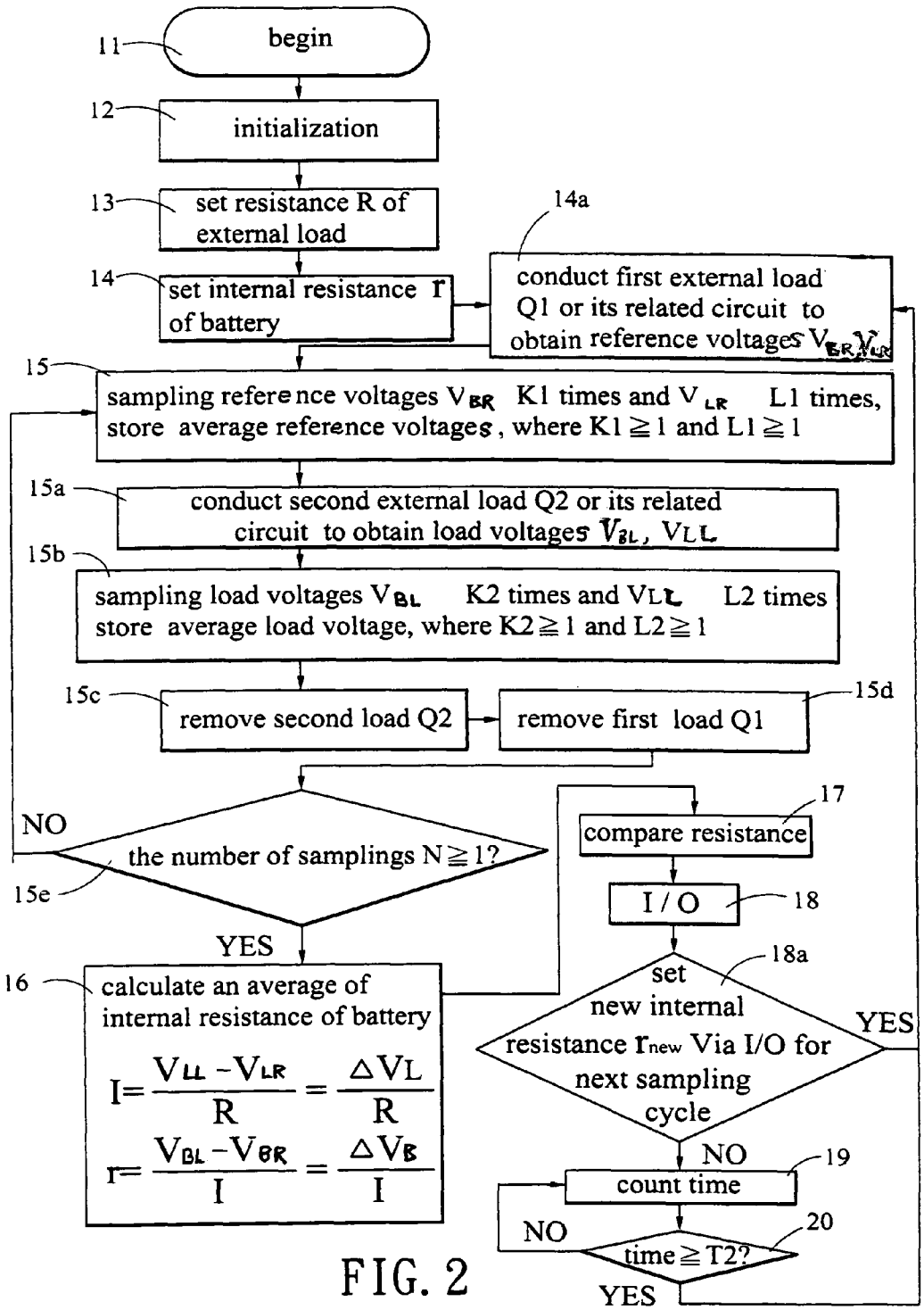
FIG. 2 is a detailed flow chart illustrating the FIG. 1 process.
Figure 7:
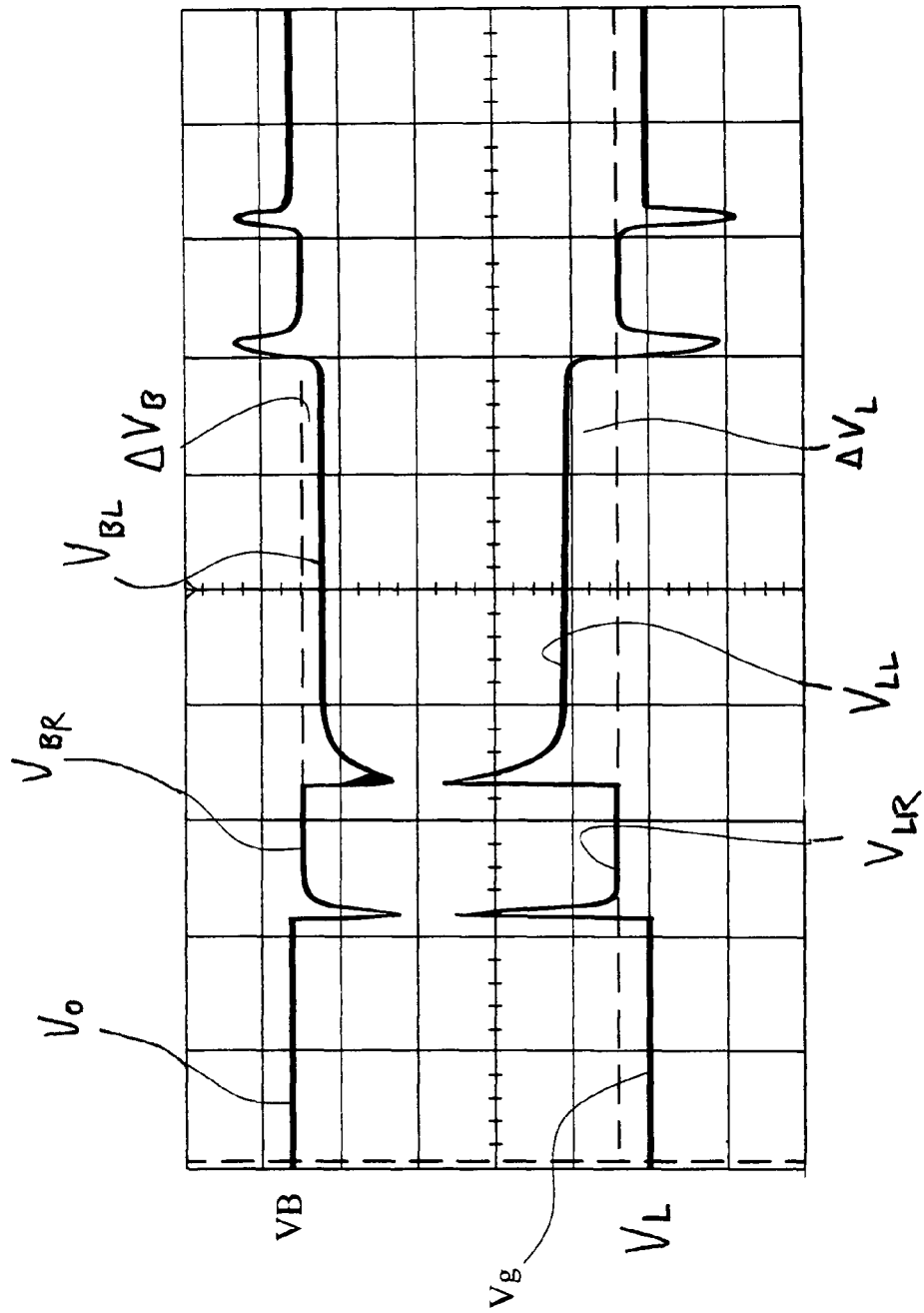
FIG. 7 plots sampled voltage versus sampling time for voltage curves according to the invention.

Referring to FIGS. 2, 7 and 8, the detailed method steps of the above process are illustrated.

In step 11, the process begins by setting an interrupt vector address as an initial address of a program.

In step 12, a register and I/O pins are initialized for setting an initial value of the register, the interrupt vector and timer are activated, and the state and initial value of each I/O pin of the microprocessor control unit (MCU) (described further below) is defined.

In step 13, the resistance (R) of the external load is set between 25 uΩ to 5000 mΩ is selected, typically based on operator input of battery type. The resistance R of the external load can be amplified.

In step 14, the predetermined nominal value to which the internal resistance r of the battery will be compared is set as 0.001Ω to 1.5Ω, likewise typically based on operator input of battery type. An appropriate setting value depends on the precise application so as to provide a predetermined warning value before the end of discharging (see FIG. 8).

In step 14a, a first power transistor Q1 or its related circuit serving as a first external load is controlled to conduct so that a large amount of transient current is drawn. Reference voltages $V_{BR}$ across the battery and $V_{LR}$ across the load (see FIG. 7) are measured and stored.

More specifically, in step 15, the reference voltage $V_{BR}$ across the battery is sampled a plurality of times. The transient sampling time is set to no more than about 0.01 second. As shown in FIG. 7, a very large transient current is drawn by causing the first power transistor Q1 or its related circuit to conduct current between the two terminals of the battery; the reference voltage $V_{BR}$ (as shown in FIG. 7) between two terminals of the battery to be measured is sampled K1 times, where K1≧1. Similarly, the reference voltage $V_{LR}$ between two terminals of the external load is sampled L1 times, where L1≧1, while the transient current is drawn. Average values of reference voltages $V_{BR}$ and $V_{LR}$ are then calculated and stored. The large transient current is preferably in the range of 1 A to 500 A.

In step 15a, a second power transistor Q2 or its related circuit serving as a second external load is operated to conduct so that a large amount of transient current is drawn. Load voltages $V_{BL}$ across the battery and $V_{LL}$ across the second external load are then obtained.

More specifically, as indicated at step 15b, the load voltages $V_{LL}$ and $V_{BL}$ are sampled a plurality of times. The transient sampling time is typically 0.01 second. As shown in FIG. 7, a transient large current is provided by controlling the second power transistor Q2 or its related circuit to conduct, so that a large current is drawn. The load voltage $V_{BL}$ between two terminals of the battery to be measured is sampled K2 times, where K2≧1, the load voltage $V_{LL}$ between two terminals of the load is sampled L2 times, where L2≧1, and the average value of voltages $V_{BL}$ and $V_{LL}$ are calculated and stored. The large transient current is preferably in the range of 1 A to 500 A.

More specifically, "large transient current" as used herein is typically a current equal to between 1 C and 5 C, where C, as is usual in the industry, is the number of ampere-hours (a-h) that can be provided by a given battery in 20 hours. For example, a battery rated at 34 a-h can deliver 34 a-h if discharged over a period of 20 hours, so 1 C for this battery is 34 amperes.

In step 15c, the second external load having second load resistance (i.e., second power transistor Q2 or its related circuit) is removed. The second power transistor Q2 or its related circuit is cut off with no transient large current output.

In step 15d, the first external load having first load resistance (i.e., first power transistor Q1 or its related circuit) is removed. The first power transistor Q1 or its related circuit is cut off with no transient large current output In step 15e, it is determined whether the number of samples is equal to N, where N≧1. If yes, the process goes to step 16. Otherwise, the process loops back to step 15.

In step 16, the average of the internal resistance r of the battery to be measured is calculated. First, the current I drawn from the battery while the second load is connected is determined. I can be obtained by the following equation.

$$I = \frac{V_{LL} - V_{LR}}{R} = \frac{\Delta V_L}{R} \qquad \text{EQ. 1}$$

where R is the resistance of the second external load.
Other methods of measuring I are discussed below.
Then, the internal resistance r of the battery to be measured is calculated by the following equation.

$$r = \frac{V_{BL} - V_{BR}}{I} = \frac{\Delta V_r}{I} \qquad \text{EQ. 2}$$

More specifically, in order to fully understand the above two equations, let us assume the value of the external load R=1 mΩ, and, as illustrated in FIG. 7, the curve $V_B$ represents the voltage across two terminals of the battery to be measured, and the curve $V_R$ represents the voltage across two terminals of the external load R. It is assumed that in FIG. 7, the values are $V_0$=12.70 volt, $V_{BR}$=12.30 volt, $V_{BL}$=11.55 volt, $V_g$=0 volt, $V_{LR}$=0.25 volt, $V_{LI}$=0.4 volt. Thus, from EQ. 1, we obtain the transient large current I=$\Delta V_L$/R, I=(0.4−0.25)/1×0.001=0.15/0.001=150 (amperes); and From EQ. 2, we can then obtain the value of the internal resistance r of the battery as r=$\Delta V_r$/I=(12.30−11.55)/150=0.005(Ω)=5 (mΩ).

In step 17, the internal resistance (r) of the battery obtained in step 16 is compared to the predetermined nominal value of internal resistance of the battery selected in step 14 so as to determine whether the former is in a warning range.

In step 18, an I/O device (e.g., a keyboard input, a wireless operation, net work, USB (Universal Serial Bus) connector, databus, CAN (Controller Area Network) bus, GPS (Global Positioning System), SMS (Simple Message Service), MMS (Multimedia Message Service), WAP (Wireless Application Protocol) or access to the Internet is employed to communicate the value obtained in step 17 to a driver or other operator.

In step 18a, a new nominal value $r_{new}$ for the internal resistance of the battery may be selected via an I/O device for a next sampling cycle. If yes, the process loops back to step 14a. Otherwise, the process goes to step 19.

In step 19, timer begins to count time.

In step 20, it is determined whether time is equal to time T2 of a next sampling. If yes, the process loops back to step 14a for a next sampling. Otherwise, the process loops back to step 19. That is, the condition of the battery is evaluated from time to time, so as to reduce the total current drawn.

The voltage sampling process from step 15 to step 15e takes one period of time. This is depicted in the graph of FIG. 7 of sampled voltage versus sampling time for voltage curves according to the invention. The upper curve $V_B$ is the voltage measured across the battery, while the lower curve $V_L$ is the voltage measured across the load (noting that certain portions of curve $V_L$ may show the voltage across different first and second external loads.) $V_o$ is the nominal voltage across the battery, and is not employed in the method of the invention. Similarly, $V_g$ is the voltage across the load when not conducting, and is likewise not considered. Voltage curve $V_{BR}$ represents a reference voltage taken at two terminals of the battery 7 and voltage curve $V_{LR}$ represents a reference voltage taken at two terminals of the first external load (see FIGS. 3 and 4), both measured while a first transient large current is drawn responsive to connection of a first external load. Similarly, voltage curve $V_{BL}$ represents the load voltages taken at the terminals of the battery and voltage curve $V_{LL}$ represents the load voltage taken at two terminals of the second external load (see FIGS. 3 and 4), both being measured while a second transient large current is drawn responsive to connection of a second external load.

Referring to the voltage curves in FIG. 7 again, the sampling with respect to respective voltage curves can be best understood. Curves $V_{BR}$ and $V_{LR}$ are the reference battery and load voltage curves obtained while the first load is connected. Curves $V_{BL}$ and $V_{LL}$ are the load battery and load voltage curves obtained while the second external load is connected. In detail, voltage curve $V_{BR}$ represents a reference voltage measured across the battery responsive to conduction of the of the first power transistor Q1 (that is, connection of the first load) having been sampled K1 times. Voltage curve $V_{BL}$ represents a load voltage measured across the battery responsive to conduction of the second power transistor Q2 (that is, connection of the different second load) having been sampled K2 times. Likewise, voltage curve $V_{LR}$ represents a reference voltage across the first load responsive to conduction of the of the first power transistor Q1 (that is, connection of the first load) having been sampled L1 times, and voltage curve $V_{LL}$ represents a load voltage measured across the second load responsive to conduction of the second power transistor Q2 (that is, connection of the second load) having been sampled L2 times. $\Delta V_B$ is the difference between $V_{BR}$ and $V_{BL}$. $\Delta V_L$ is the difference between $V_{LR}$ and $V_{LL}$.

Figure 3:
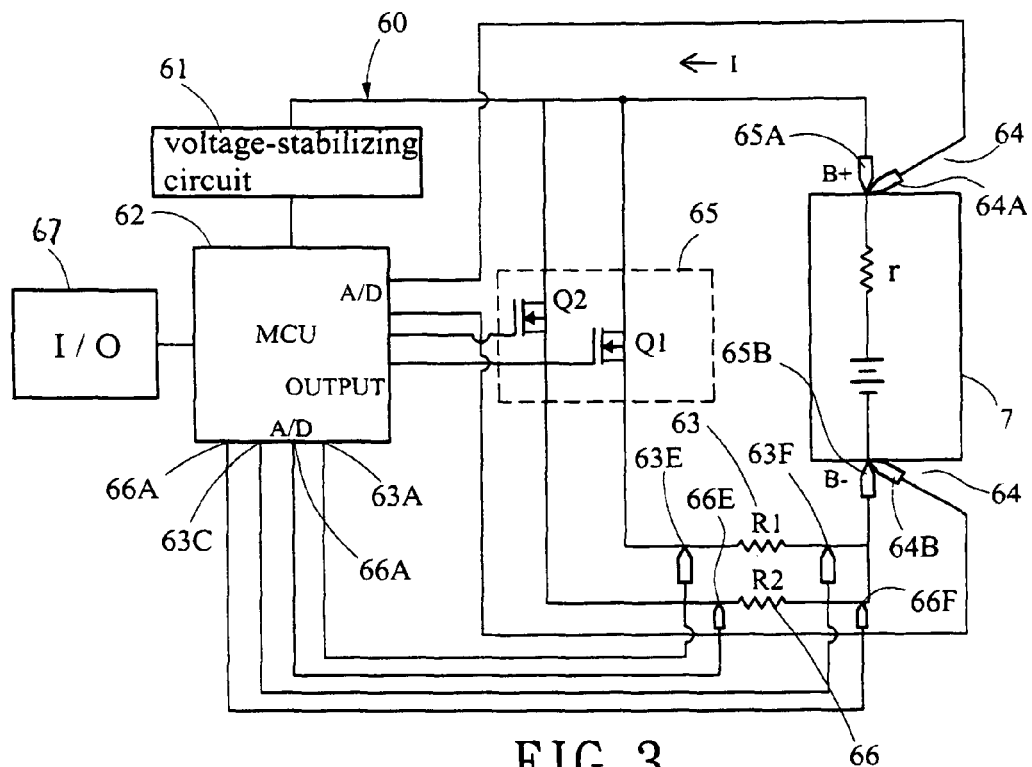
FIG. 3 is an electrical block diagram of a first preferred embodiment of apparatus for monitoring the battery's electric power according to the invention.

Referring to FIG. 3, there is shown an electrical block diagram of a first preferred embodiment of apparatus 60 for monitoring the battery's electric power according to the invention. In this embodiment, the current I is measured by connecting two discrete known external resistances R1 and R2 across the battery by way of series-connected switching transistors Q1 and Q2. Equation 1 above can then be used to determine I, and this in turn used to determine r, the internal resistance of the battery. In other embodiments, discussed below, a single known external load R is provided, and I is measured somewhat differently.

FIG. 3 illustrates a Kelvin connection formed by connections 64A and 64B, 65A and 65B, to battery 7. With such a Kelvin connection, two sets of connections are provided to the positive and negative terminals of battery 7. One pair of electrical connections 65A and 65B are used to draw a large amount of transient current, while the other pair of connections 64A and 64B can be used to sample accurate voltage values. As the resistance value between connections 64A, 64B and the A/D inputs of the microprocessor 62 to which they are connected is very small, substantially no current flows through the connections 64A, 64B and the A/D inputs, and there will be little voltage drop between the battery and the A/D inputs, thereby providing more accurate voltage measurements.

The apparatus 60 comprises a MCU (microprocessor control unit) 62, a voltage-stabilizing circuit 61 (optionally provided depending on the actual application), first and second external loads 63 and 66, a voltage-sampling circuit 64, a transient current control circuit 65, and an I/O device 67. Each component will be described in detail below.

The MCU 62 is responsible for controlling the apparatus 60 so as to send control signals to the transient current control circuit 65, sampling the voltages across battery 7 and differing external loads at predetermined intervals of time, calculating the internal resistance r of the battery 7, and comparing the warning value of internal resistance r with a predetermined nominal value thereof for warning if necessary.

The voltage-stabilizing circuit 61 is optionally used for providing a stable voltage to the apparatus 60 during operating periods, that is, if the apparatus 60 of the invention is powered from the battery 7, such that external charge sources, intermittent loads and the like might interfere with stable operation. If the apparatus 60 instead uses a stable DC cell or battery as power supply, then the voltage-stabilizing circuit 61 can be omitted.

The external loads 63 and 66 have a predetermined resistance. In a preferred embodiment of the invention, the external loads 63 and 66 each comprise combination of parallel resistors R1 and R2 and series-connected transistors Q1 and Q2. The resistance R1 of the first external load 63 is set between 25 uΩ and 5000 mΩ and is provided directly in series with the battery. Likewise, the resistance R2 of the second external load 66 is set between 25 uΩ and 5000 mΩ, though it must differ from R1, and is also provided directly in series with the battery so as to calculate the internal resistance r of the battery. Note that the external loads 63 and 66 both have very low resistance so as to be able to sample the voltage of the battery 7 in a very short transient sampling time while drawing a very large amount of transient current. For example, voltage sampling can be performed responsive to the drawing of a large amount of transient current, e.g., 1 A to 500 A, for 0.01 second.

The external loads 63 and 66 can be implemented using resistors of Manganin or any of a number of other alloys known to the art. Alternatively, the external loads 63 and 66 can be implemented as switching elements having internal resistance, for example, the internal resistance of the first and second power transistors Q1, Q2, so that the discrete external loads 63, 66 (i.e., resistors R1 and R2) in this embodiment can be omitted from the circuit of FIG. 3. Furthermore, the external loads 63, 66 can also be implemented by a section of conductor forming part of the circuit extending between two terminals of the battery, such as a portion of conductor between two terminals 63E and 63F (without R1), two terminals 66E and 66F (without R2), or the sections of conductor between A/D inputs and the corresponding points at which the voltage is sensed, i.e., the length of conductor between connections 63A-63E, 63C-63F, 66A-66E, 66C-66F.

In a preferred embodiment of the invention, the voltage-sampling circuit 64 is responsible for sampling voltage across two connections 64A, 64B. As shown in FIG. 3, one connection 64A is electrically interconnected between a positive A/D input pin of MCU 62 and a positive terminal of the battery 7 and the other connection 64B is electrically interconnected between a negative A/D input pin of MCU 62 and a negative terminal of the battery 7. This allows the correct voltage to be sampled. That is, signal conductors connected to connections 64A, 64B allow measurement of the voltage across the battery 7 separately from the voltage across the load R.

The transient current control circuit 65 is controlled by the MCU 62. The transient current control circuit 65 serves as a switch of the apparatus and is responsible for controlling drawing of a transient large current by the load. That is, a regulated transient large current is drawn from the battery 7 for sampling voltage thereof during voltage sampling periods.

In the FIG. 3 embodiment, the transient current control circuit 65 is implemented as a first power transistor Q1 and a second power transistor Q2 both connected in series with the battery and the discrete loads R1, R2. Thus, the transistors Q1, Q2 serve primarily as switching elements selectively connecting loads R1, R2 across the battery, and the load voltages are measured directly across these discrete loads. As discussed above, the internal resistances of the transistors Q1, Q2 can also themselves serve as the first and second external loads, whereby the load voltages are measured across the corresponding transistors, and possibly also the connecting conductors employed. In other embodiments discussed below, the transistors Q1, Q2 serve as part of the external load, and the load voltage is measured across a series-connected load element.

The I/O device 67 is responsible for external interface functions, including accepting user input of the specification of the battery, and indicating a warning of incipient battery failure if the comparison of the internal resistance of the battery with the set warning nominal value of internal resistance of the battery shows that a warning value has been reached. These interface functions can be accomplished in a variety of ways, from an indicator lamp on the dashboard of an automobile to employment of keyboard for user input, a wireless operation, connection to an external device by any of USB (Universal Serial Bus) connection, CAN (Controller Area Network) bus, GPS (Global Positioning System), SMS (Simple Message Service), MMS (Multimedia Message Service), WAP (Wireless Application Protocol), by access to the Internet, or otherwise.

In brief, after connecting the apparatus 60 for monitoring the battery's electric power according to the invention to the battery 7, the MCU 62 then performs the above operations based on the inventive method of monitoring electric power of a battery by comparing its internal resistance to a nominal value. First, the transistor Q1 of the transient current control circuit 65 is controlled to conduct to cause a transient large amount of current to be drawn, while the voltage-sampling circuit 64 samples reference voltages $V_{BR}$ across two terminals of the battery 7 and $V_{LR}$ across two terminals of the external load 63, respectively. The second power transistor Q2 of the transient current control circuit 65 is then caused to conduct to provide a transient large amount of current to be drawn through a second different load, while the voltage-sampling circuit 64 samples load voltage $V_{BL}$ across two terminals of the battery 7 and $V_{LL}$ across two terminals of the external load 66. After sampling the reference voltages and load voltages N times in a predetermined period of time, the MCU 62 then calculates the internal resistance r of the battery 7 by means of the sampled reference and load voltages and two equations as described above in step 16 of FIG. 2. The internal resistance r of the battery 7 thus calculated is then compared with the predetermined nominal value for the internal resistance of the battery. Finally, a warning is issued through the I/O device 67 if necessary.

Figure 4:
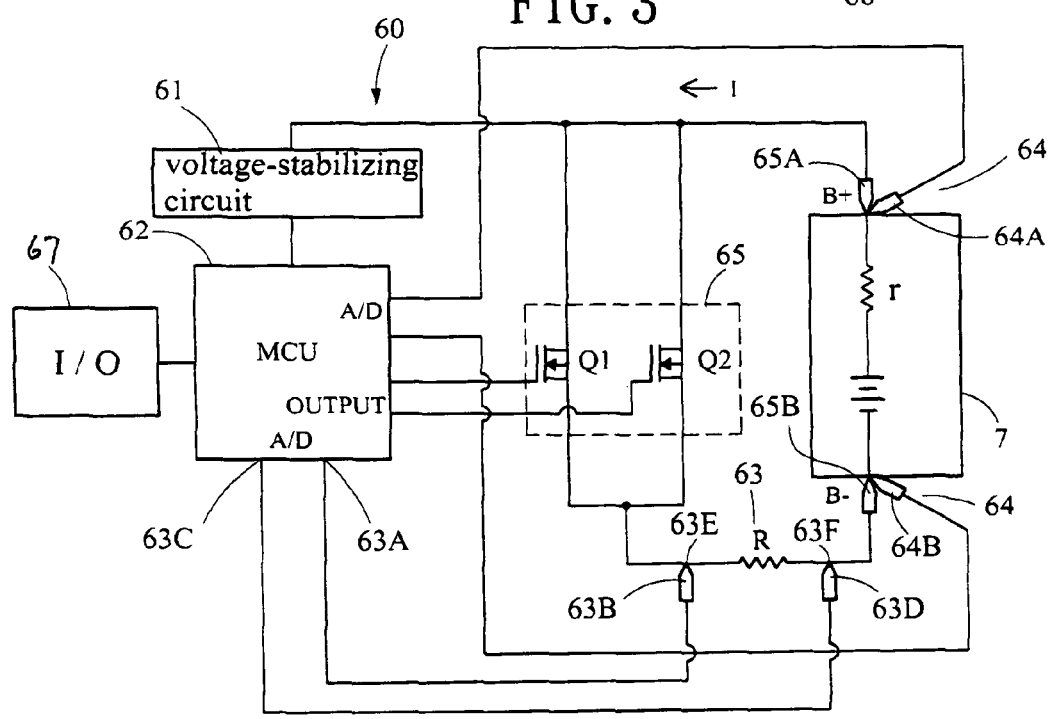
FIG. 4 is an electrical block diagram of a second preferred embodiment of apparatus for monitoring the battery's electric power according to the invention.

Referring to FIG. 4, there is shown an electrical block diagram of a second preferred embodiment of apparatus 60 for monitoring the power of a battery according to the invention. Operation of the apparatus of the invention, and determination of the internal resistance of the battery 7, are essentially as described above; however, the current I (again, the current drawn from battery during connection of the second external load thereacross) is measured in a slightly different way. In this embodiment, and also in those of FIGS. 5 and 6 discussed below, the transient current control circuit 65 of the apparatus 60 is implemented as two parallel transistors Q1 and Q2, connected so that either one or both of Q1 and Q2 can be caused to conduct current through a single external load 63 having a known resistance R. If only Q1 is conductive, a reference load voltage $V_{LR}$ can be measured across R using connections 63B and 63D; then Q2 can be caused also to conduct. Because Q1 and Q2 are in parallel, and have internal resistance, a different amount of current will be drawn, and a different load voltage $V_{LL}$ measured across R. I can then be calculated by dividing the difference between $V_{LR}$ and $V_{LL}$ by R. $V_{BR}$, the voltage across the battery measured while only Q1 is conducting, and $V_{BL}$, the voltage measured while both Q1 and Q2 are conducting, will have been measured at the same times. The internal resistance r of the battery is then calculated as above, by dividing the difference between $V_{BR}$ and $V_{BL}$ by I.

Figure 5:
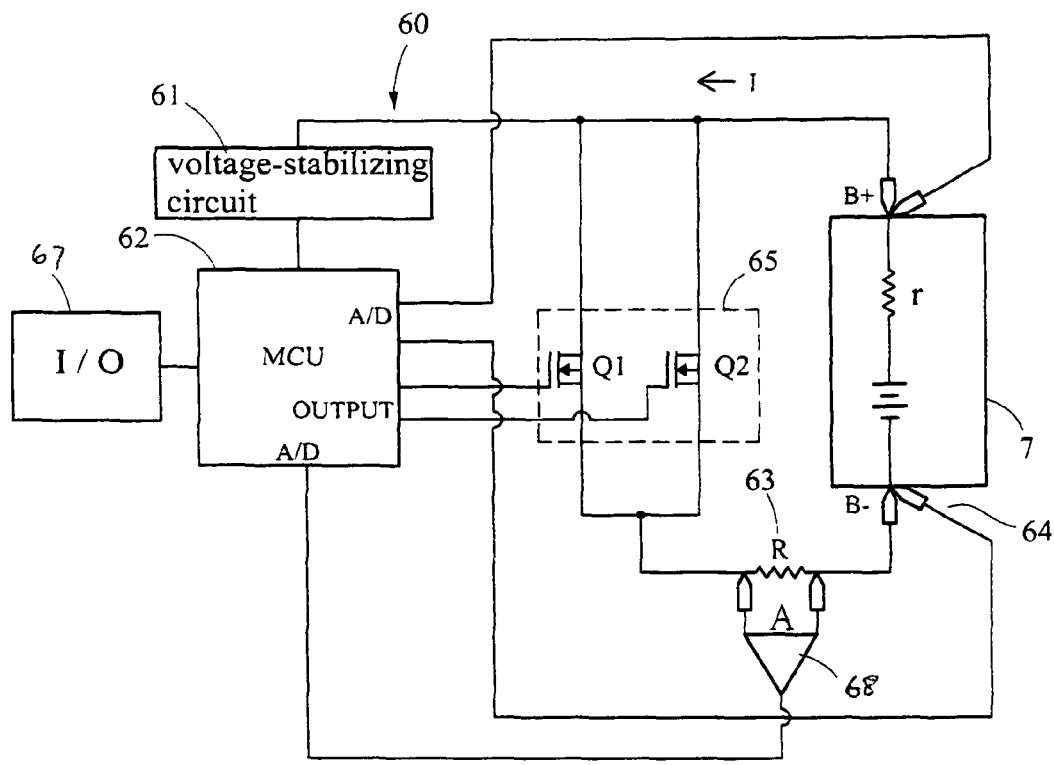
FIG. 5 is an electrical block diagram of a third preferred embodiment of apparatus for monitoring the battery's electric power according to the invention.

Referring to FIG. 5, there is shown an electrical block diagram of a third preferred embodiment of apparatus 60 for monitoring the power of a battery according to the invention. The FIG. 5 embodiment and its operation are identical to that of FIG. 4, except that the voltage across the external resistance 63 is amplified by an amplifier 68 prior to measurement by the MCU 62. The external load 63 has a very low resistance R. Preferably, the external load 63 has a resistance R lower than 5000 uΩ.

Figure 6:
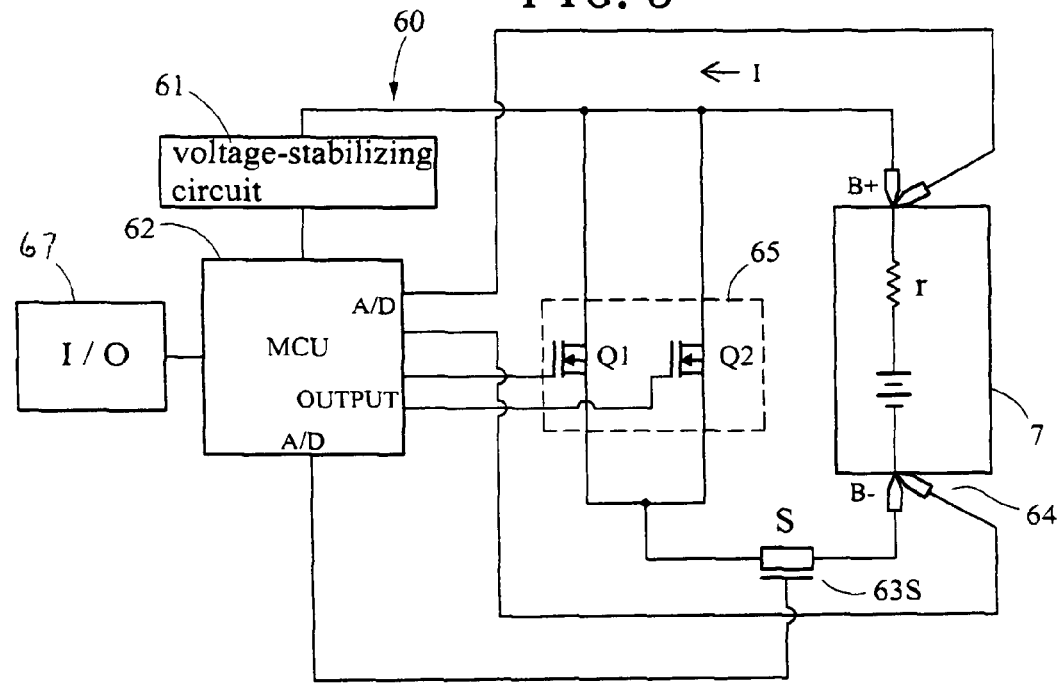
FIG. 6 is an electrical block diagram of a fourth preferred embodiment of apparatus for monitoring the battery's electric power according to the invention.

Referring to FIG. 6, there is shown an electrical block diagram of a fourth preferred embodiment of apparatus 60 of monitoring the power of a battery according to the invention. The FIG. 6 embodiment and its operation are identical to that of FIG. 4, except that external load 63 is implemented as a shunt unit S labeled as 63S. The shunt unit 63S is a known device for measuring current flowing through a known resistance, whereby I can be measured directly rather than by application of Eq. 1 above.

While the invention herein disclosed has been described by means of specific embodiments, numerous modifications and variations could be made thereto by those skilled in the art without departing from the scope and spirit of the invention, as set forth in the claims which follow.

What is claimed is:

1. A method of monitoring the electric power of a battery by measuring an internal resistance of the battery, comprising the steps of:
   (1) coupling a first power transistor across the two terminals of the battery to provide a first known external load, so as to draw a first transient current for a very transient sampling time, while measuring the voltage across the battery, thus obtaining a reference voltage;
   (2) coupling a second power transistor across the two terminals of the battery to provide a second known external load, so as to draw a second transient current for a very transient sampling time while the first load is still coupled across the two terminals of the battery, and while measuring the voltage across the battery, thus obtaining a load voltage, and measuring the second transient current; and
   (3) calculating the internal resistance of the battery by subtracting the load voltage from the reference voltage and dividing by the second transient current.

2. The method of claim 1, comprising the further step of comparing the calculated internal resistance of the battery to a predetermined nominal value of the internal resistance of the battery to be measured in the range of 0.001Ω to 1.5Ω.

3. The method of claim 1, wherein the resistance of the external loads is in a range from 25 uΩ to 5000 mΩ.

4. The method of claim 1, wherein the voltage across the resistance of the external load is amplified prior to measurement.

5. The method of claim 1, wherein the external load is provided as an internal resistance of either power transistor.

6. The method of claim 1, wherein the transient currents are in a range from 1 A to 500 A.

7. The method of claim 1, wherein the transient sampling time is less than 0.01 second.

8. The method of claim 1, wherein the voltage across the battery is measured through Kelvin connections.

9. A method of measuring the internal resistance of a battery, comprising the steps of: (1) choosing an external load, the resistance R of which is selected in accordance with the type of the battery to be evaluated, (2) choosing a first power transistor or its related circuit as a first external load; (3) connecting the first external load across two terminals of the battery and controlling the first power transistor to conduct so that a transient current is drawn from the battery by the first external load for a very transient sampling time, while sampling a first reference voltage $V_{BR}$ between two terminals of the battery and sampling a second reference voltage $V_{LR}$ between two terminals of the external load; (4) choosing a second power transistor or its related circuit as a second external load; (5) connecting the second external load across two terminals of the battery and controlling the second power transistor to conduct so that a transient current is drawn from the battery by the second external load at a very transient sampling time while sampling a first load voltage $V_{BL}$ between two terminals of the battery and sampling a second load voltage $V_{LL}$ between two terminals of the external load; (6) determining the transient current I drawn by the load by subtracting $V_{LL}$ from $V_{LR}$ and dividing the difference by the resistance R of the second external load; and (7) calculating the internal resistance r of the battery by subtracting $V_{BR}$ from $V_{BL}$ and dividing the difference by the transient current I.

10. The method of claim 9, comprising the further steps of: (8) comparing the calculated internal resistance r of the battery to be measured to a predetermined nominal value of the internal resistance of the battery to be measured so as to determine whether the former is equal to or larger than the predetermined nominal value; and (9) issuing a warning through an input and output (I/O) device if the determination in step (8) is affirmative.

11. The method of claim 9, wherein steps (3) and (5) are performed repetitively, and average values of $V_{BR}$, $V_{LR}$ $V_{BL}$, and $V_{LL}$ are determined and used in calculation of I and r.

12. The method of claim 10, wherein the predetermined nominal value of the internal resistance of the battery to be measured is 0.001Ω to 1.5Ω.

13. The method of claim 9, wherein the resistance of the external loads is in a range from 25 uΩ to 5000 mΩ.

14. The method of claim 9, wherein the voltage across the external load is amplified prior to measurement.

15. The method of claim 9, wherein one or both of the external loads is provided as an internal resistance of the corresponding power transistor.

16. The method of claim 9, wherein the transient currents are in a range from 1 A to 500 A.

17. The method of claim 9, wherein the transient sampling time is less than 0.01 second.

18. The method of claim 9, wherein the I/O device comprises one or more of a display, a keyboard input, a wireless operation, a network, USB (Universal Serial Bus) connector, a databus, CAN (Controller Area Network) bus, GPS (Global Positioning System), SMS (Simple Message Service), MMS (Multimedia Message Service), WAP (Wireless Application Protocol) or an access to the Internet.

19. The method of claim 9, wherein the values for the voltage across the battery are measured through Kelvin connections.

20. A method of evaluating the condition of a battery, comprising the steps of: (1) choosing an external load, a resistance R of which is based on the type of the battery to be evaluated; (2) selecting a value for a nominal internal resistance of the battery in accordance with its type; (3) connecting a first power transistor across the battery so that if the first power transistor is controlled to conduct, a first external load is placed in series with the battery, whereby a transient current is drawn from the battery; (4) controlling said first power transistor to conduct while transiently sampling between two terminals of the battery and across the first external load for a plurality of times, so as to obtain an average sampled reference voltage $V_{BR}$ between two terminals of the battery and a sampled reference voltage $V_{LR}$ between two terminals of the external load; (5) connecting a second power transistor across the battery so that if the second power transistor is controlled to conduct, a second external load is placed in series with the battery, whereby a second transient current is drawn from the battery; (6) controlling said second power transistor to conduct while transiently sampling between two terminals of the battery and across the second external load for a plurality of times, so as to obtain an average sampled load voltage $V_{BL}$ between two terminals of the battery and an average sampled load voltage $V_{LL}$ between two terminals of the external load; (7) determining the transient current I drawn by the second external load by subtracting $V_{LR}$ from $V_{LL}$ and dividing by the resistance R of the second external load; (8) calculating the internal resistance r of the battery by subtracting $V_{BR}$ from $V_{BL}$ and dividing by the transient current I of the battery; and (9) comparing the obtained internal resistance r of the battery to be measured with the selected nominal value thereof to determine the condition of the battery to be measured.

21. The method of claim 20, wherein the transient sampling time is less than 0.01 second.

22. The method of claim 20, comprising the further step of providing an output by way of an I/O device comprising one or more of a display, a keyboard input, a wireless operation, a USB (Universal Serial Bus) connector, CAN (Controller Area Network) bus, GPS (Global Positioning System), SMS (Simple Message Service), MMS (Multimedia Message Service), WAP (Wireless Application Protocol) or an access to the Internet.

23. The method of claim 20, wherein the voltage across the battery is measured through Kelvin connections.

24. An apparatus for monitoring the condition of a battery by coupling a first power transistor across the battery to provide a first external load to obtain a sampled battery reference voltage and a sampled reference load voltage and coupling a second power transistor across the battery to provide a second external load to obtain a sampled battery load voltage and a sampled second load voltage, comprising: a controller for controlling the apparatus so as to sample a voltage across the battery at predetermined periods of time responsive to imposition of a known external load chosen responsive to the type of the battery, calculate an internal resistance of the battery to be measured, and compare the internal resistance of the battery to be measured with a predetermined nominal value therefor; first and second external loads both controllably coupled in series with the battery; a transient current control circuit connected across two terminals of the battery, being responsive to control signals from the controller, and including the first power transistor and the second power transistor, so that transient currents are drawn from the battery by the first and second external loads responsive to control signals from the controller, a voltage-sampling circuit responsible for sampling voltages across two terminals of the battery for one or more very transient sampling times, said controller being operable to divide a difference between the sampled second load voltage and the sampled reference load voltage by the resistance of the second external load to obtain a transient current of the battery; and dividing a difference between the sampled reference battery voltage and the sampled load voltage by the transient current of the battery so as to calculate the internal resistance of the battery to be measured; and an input/output (I/O) device responsive to the controller for issuing a warning responsive to comparison of the calculated value of the internal resistance of the battery with the predetermined nominal value thereof.

25. The apparatus of claim 24, wherein the apparatus further comprises an amplifier for amplifying the voltage across the external load prior to measurement.

26. The apparatus of claim 24, wherein the external loads comprise the internal resistance of the power transistors.

27. The apparatus of claim 24, wherein the resistance of each of the first and second external loads is in a range from 25 uΩ to 5000 mΩ.

28. The apparatus of claim 24 wherein the predetermined nominal value of the internal resistance of the battery is 0.001Ω to 1.5Ω.

29. The apparatus of claim 24, wherein the transient currents are in a range from 1 A to 500 A.

30. The apparatus of claim 24, wherein the voltage sampling time is less than 0.01 second.

31. The apparatus of claim 24, wherein the I/O device comprises one or more of a display, a keyboard input, a wireless communication device, a network, USB (Universal Serial Bus) connector, a databus, CAN (Controller Area Network) bus, GPS (Global Positioning System), SMS (Simple Message Service), MMS (Multimedia Message Service), WAP (Wireless Application Protocol) or access to the Internet.

32. The apparatus of claim 24, wherein the voltage across the battery is measured through Kelvin connections.

* * * * *